(12) United States Patent
Ubahara

(10) Patent No.: US 8,030,673 B2
(45) Date of Patent: Oct. 4, 2011

(54) NITRIDE SEMICONDUCTOR LIGHT EMITTING ELEMENT

(75) Inventor: Nobuhiro Ubahara, Tokushima (JP)

(73) Assignee: Nichia Corporation, Anan-shi (JP)

( * ) Notice: Subject to any disclaimer, the term of this patent is extended or adjusted under 35 U.S.C. 154(b) by 103 days.

(21) Appl. No.: 12/580,030

(22) Filed: Oct. 15, 2009

(65) Prior Publication Data

US 2010/0096650 A1 Apr. 22, 2010

(30) Foreign Application Priority Data

Oct. 17, 2008 (JP) ................................. 2008-268204

(51) Int. Cl.
*H01L 33/00* (2010.01)

(52) U.S. Cl. ..... 257/96; 257/97; 257/103; 257/E33.025; 257/E33.028

(58) Field of Classification Search ............. 257/96, 257/97, 103, E33.08, E33.025, E33.028
See application file for complete search history.

(56) References Cited

U.S. PATENT DOCUMENTS

| 6,608,330 | B1 | 8/2003 | Yamada | |
|---|---|---|---|---|
| 7,705,364 | B2* | 4/2010 | Lee et al. ........................ | 257/96 |
| 7,750,337 | B2* | 7/2010 | Kozaki ............................ | 257/14 |
| 2003/0197188 | A1 | 10/2003 | Watatani | |
| 2004/0026710 | A1* | 2/2004 | Tsuda et al. ................... | 257/103 |
| 2007/0090339 | A1* | 4/2007 | Lee et al. ........................ | 257/14 |
| 2007/0290230 | A1* | 12/2007 | Kawaguchi et al. .......... | 257/196 |
| 2008/0251781 | A1* | 10/2008 | Han et al. ........................ | 257/13 |
| 2008/0308787 | A1* | 12/2008 | Lee et al. ........................ | 257/13 |
| 2009/0194784 | A1* | 8/2009 | Kaji et al. ..................... | 257/103 |
| 2010/0072457 | A1* | 3/2010 | Iguchi et al. .................... | 257/21 |
| 2010/0270531 | A1* | 10/2010 | Samal ............................ | 257/13 |

* cited by examiner

*Primary Examiner* — Ngan Ngo

(74) *Attorney, Agent, or Firm* — Birch, Stewart, Kolasch & Birch, LLP.

(57) ABSTRACT

Provided is a nitride semiconductor light emitting element capable of producing an emission spectrum having two peaks with stable ratio of emission peak intensity. The nitride semiconductor light emitting 1 comprises an active layer 12 disposed between an n-type nitride semiconductor layer 11 and a p-type nitride semiconductor layer 13. The active layer 12 comprises a first well layer 14, second well layers 15 interposing the first well layer 14 and disposed at outermost sides among the well layers, and barrier layers 16, 17 disposed between each of the well layers. The second well layer 15 comprises a nitride semiconductor having a larger band gap energy than the band gap energy of a nitride semiconductor constituting the first well layer 14, and the nitride semiconductor light emitting element 1 has peaks in the emission spectrum respectively corresponding to the first well layer 14 and the second well layer 15.

18 Claims, 8 Drawing Sheets

NITRIDE SEMICONDUCTOR LIGHT EMITTING ELEMENT

CROSS-REFERENCE TO RELATED APPLICATIONS

The present application claims priority under 35 U.S.C. §119 to Japanese Patent Application No. 2008-268204, filed in Japan on Oct. 17, 2008, the contents of which are incorporated hereinto by reference.

BACKGROUND OF THE INVENTION

1. Field of the Invention

The present invention relates to a nitride semiconductor light emitting element, in particular, a nitride semiconductor light emitting element having a plurality of peaks in its emission spectrum.

2. Discussion of the Related Art

In recent years, semiconductor light emitting elements capable of emitting light in the ultraviolet region have been put into practical use, which are also used in an exposure apparatus, a disinfection apparatus, and the like. However, in the cases where a semiconductor light emitting element is used in a ultraviolet irradiating apparatus for curing a material, with a larger thickness of the irradiated material, insufficient curing of a deeper portions may result. The reasons include that the ultraviolet irradiation cannot penetrate into a deeper portion of the irradiated material. In order to allow light to penetrate deeper into the irradiated material from the surface to a deeper portion, it is efficient that the ultraviolet irradiating apparatus has a plurality of emission peak wavelengths. To obtain such an apparatus, a plurality of semiconductor light emitting elements having different peak wavelengths or a semiconductor light emitting element having a plurality of active layers having different compositions may be employed (see Japanese Laid-Open Patent Publication No. 2007-305703).

A semiconductor light emitting element having a plurality of well layers with varying compositions may be intended to provide white light with a single semiconductor light emitting element. Specific examples thereof include a structure having well layers of different emission wavelengths stacked in order of wavelength, and a structure having a repetitive stack of such structures (see Japanese Laid-Open Patent Publications Nos. H10-22525, 2001-28458, and 2004-128443).

Other examples of varying compositions in the active layer include a quantum well structure having a strain compensating layer with a larger band gap energy than that of a barrier layer interposed between the barrier layer and a well layer (see Japanese Laid-Open Patent Publication No. 2004-87763).

However, in the semiconductor light emitting element in which well layers of different emission wavelengths are simply stacked in order of wavelength, it is difficult to produce an efficient and stable ratio of emission peak intensity. For example, in a case where a well layer of longer wavelength emission having a smaller band gap energy is disposed closer to the n-type semiconductor layer side than a well layer of shorter wavelength emission having a larger band gap energy, the luminous efficiency in longer wavelength decreases, so that stable ratio of emission peak intensity is difficult to obtain. Such a nitride semiconductor light emitting element having unstable ratio of emission peak intensity is unsuitable as the light source for curing a resin or an ink.

On the other hand, if a well layer of longer wavelength emission is disposed closer to the p-type nitride semiconductor layer side than a well layer of shorter wavelength emission, emission from the well layer of longer wavelength emission is extremely facilitated, and in some cases, emission from the well layer of shorter wavelength emission may not occur.

SUMMARY OF THE INVENTION

The inventor recognized the aforementioned problems that need to be solved, and has accomplished the present invention.

As described above, in the cases where a well layer having smaller band gap energy is disposed closer to the p-type semiconductor layer side than a well layer having a larger band gap energy, single peak emission tends to be obtained, and this is considered that emission from the well layer having smaller band gap energy or a well layer which is close to the p-type semiconductor layer is facilitated, when an active layer is nitride semiconductor, especially nitride gallium based compound semiconductor. On the other hand, it is considered that in the cases where the well layer having smaller band gap energy is disposed closer to the n-type semiconductor layer side than the well layer having a bigger band gap energy, the electron confinement effect is degraded due to its small band gap energy, and the luminous efficiency is decreased, resulting in an element in which the ratio of emission peak intensity tends to fluctuate.

Thus, according to one aspect of the present invention, a nitride semiconductor light emitting element comprises an active layer disposed between an n-type nitride semiconductor layer and a p-type nitride semiconductor layer, the active layer comprises a first well layer, second well layers interposing the first well layer and disposed at outermost sides among the well layers, and barrier layers disposed between each of the well layers. The second well layer comprise a nitride semiconductor having a larger band gap energy than the band gap energy of a nitride semiconductor constituting the first well layer, and the nitride semiconductor light emitting element having peaks in the emission spectrum respectively corresponding to the first well layer and the second well layer.

The nitride semiconductor light emitting element according to one aspect of the present invention can employ a combination of structures described below.

A plurality of the first well layers are disposed between the second well layers which are disposed at the outermost sides. The second well layers comprise outermost second well layers disposed at the outermost sides among the well layers and at least one inner second well layer between the outermost second well layers, and at least one first well layer is disposed closer to the n-type semiconductor layer side than the inner second well layer. The number of layers of the second well layer is greater than the number of layers of the first well layer. A plurality of the first well layers and a plurality of the second well layers are alternately stacked.

Further, the peaks in the emission spectrum respectively corresponding to the first well layer and the second well layer are in the near-ultraviolet or ultraviolet region. The first well layer is $In_aGa_{1-a}N$ ($0<a<1$) and the second well layer is $In_bGa_{1-b}N$ ($0<b<1$, $a-b \geqq 0.02$). The first well layer is $In_aGa_{1-a}N$ ($0<a \leqq 0.1$), the second well layer is $In_bGa_{1-b}N$ ($0<b<0.1$, $a-b \geqq 0.02$), and the barrier layer is $Al_cGa_{1-c}N$ ($0<c \leqq 0.4$). The n-type nitride semiconductor layer and the p-type semiconductor layer are $Al_dGa_{1-d}N$ ($0<d \leqq 1$).

In a nitride semiconductor light emitting element according to the present invention, the outermost well layers are the second well layers having a larger band gap energy, and a first well layer having a smaller band gap energy is disposed at an inner side thereof. With this arrangement, the second well layer having a large band gap energy can emit light, and electron confinement effect can also be obtained by interposing the first well layer between the second well layers which have a larger bang gap energy. Thus, an emission spectrum having two peaks with stable ratio of emission intensity can be obtained.

BRIEF DESCRIPTION OF DRAWINGS

The invention, together with objects and advantages thereof, may best be understood by reference to the following description of the presently preferred embodiment together with the accompanying drawings in which.

DESCRIPTION OF THE EMBODIMENTS

Embodiments of the present invention will be described in detail with reference to the accompanying drawings so that the present invention may be easily put into practice by those skilled in the art.

Embodiment 1

Figure 1:
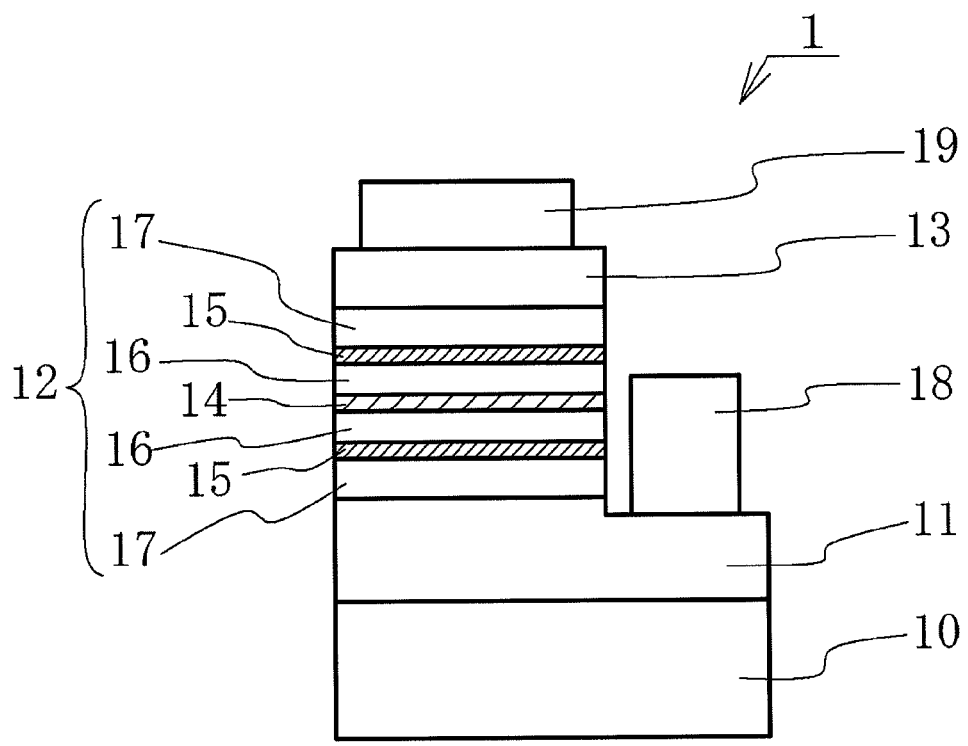
FIG. 1 is a cross-sectional view schematically showing a structure of a nitride semiconductor light emitting element according to Embodiment 1 of the present invention.

FIG. 1 is a cross-sectional view schematically showing a structure of a nitride semiconductor light emitting element according to Embodiment 1 of the present invention. The nitride semiconductor light emitting element 1 includes an n-type nitride semiconductor layer 11, an active layer 12, and a p-type nitride semiconductor layer 13, stacked in this order on a substrate 10. An n-electrode 18 is disposed on a portion of the n-type semiconductor layer 11 which is exposed by removing a portion of the p-type nitride semiconductor layer 13, and a p-electrode 19 is disposed on the p-type nitride semiconductor layer 13. The active layer 12 contains a first well layer 14 and second well layers 15 interposing the first well layer 14 therebetween, and barrier layers 16, 17. One second well layer 15 is disposed at respective outermost sides among the well layer, that is, at the closest side to the n-type nitride semiconductor layer 11 and at the closest side to the p-type nitride semiconductor layer 13. The second well layer 15 is made of a nitride semiconductor having a larger band gap energy than that of the nitride semiconductor constituting the first well layer 14. Such a nitride semiconductor light emitting element 1 has peaks respectively corresponding to the first well layer 14 and the second well layer 15 in its emission spectrum.

Figure 2:
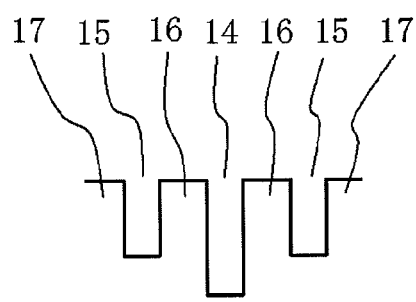
FIG. 2 is a schematic view illustrating an energy band at the active layer of the nitride semiconductor light emitting element shown in FIG. 1.
Figure 2:
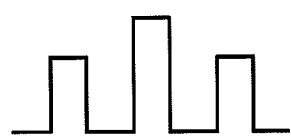

A schematic view illustrating the energy band of the active layer 12 is shown in FIG. 2. In the nitride semiconductor element of the present embodiment, the second well layer 15 corresponding to the peak at shorter wavelength side has a larger band gap energy than that of the first well layer 14 corresponding to the peak at longer wavelength side. As described above, by interposing the first well layer 14 having a smaller band gap energy between the second well layers 15 having a larger band gap energy, light can be emitted from both the first well layer 14 and the second well layers 15 and the electron can be confined in the active layer, so that the ratio of emission peak intensity can be stabilized.

Hereinafter, variant examples of the active layer 12 will be described.

Figure 3:
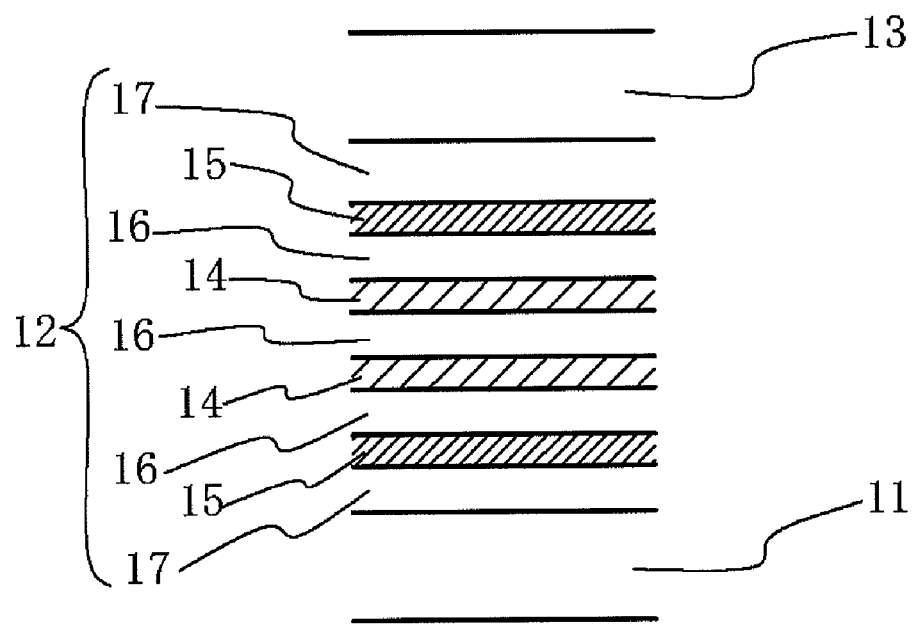
FIG. 3 is a cross-sectional view schematically showing the active layer according to a first variant example.

FIG. 3 is a diagram schematically showing a first variant example of the active layer 12, in which two first well layers 14 are stacked between the second well layers 15. As described above, a plurality of the first well layers 14 can be disposed between the second well layers 15 of the outermost sides, in which three or more first well layers 14 can also be employed. Such an active layer 12 has a structure in which the first well layer 14 is interposed between the second well layers 15 having a larger band gap energy, so that the electron can be confined in the active layer and the ratio of emission peak intensity can be stabilized.

Figure 4:
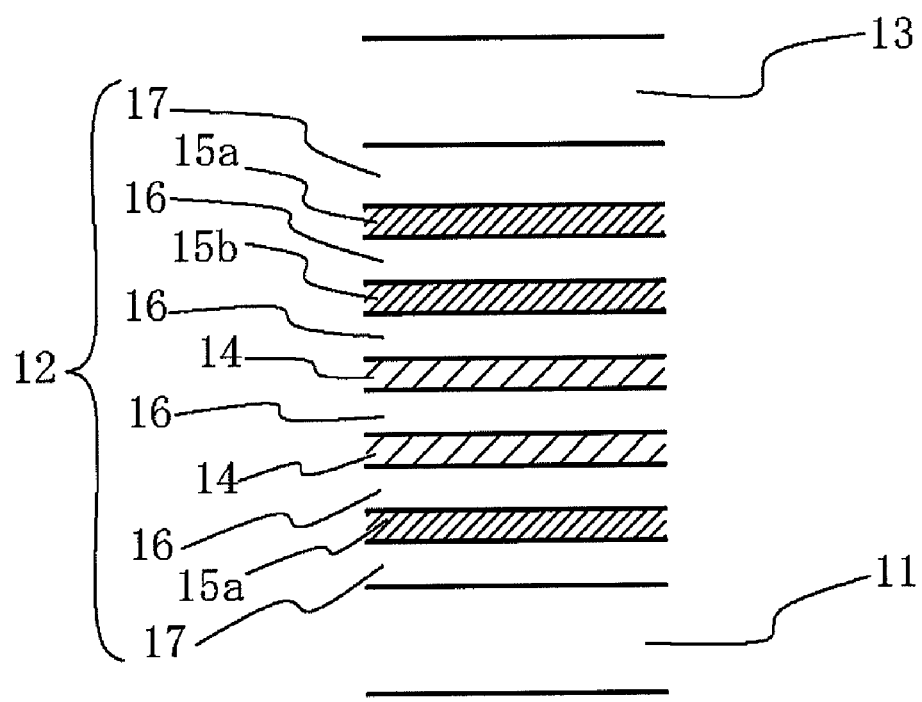
FIG. 4 is a cross-sectional view schematically showing the active layer according to a second variant example.

FIG. 4 is a view schematically showing a second variant example of the active layer 12, in which two first well layers 14 and one second well layer 15b are stacked from the n-type nitride semiconductor layer 11 in this order between the outermost second well layers 15a. As described above, one or more first well layers 14 can be disposed between the outermost second well layers 15a which are disposed at the outermost sides among the well layers, and additionally, a plurality of inner second well layers 15b can also be disposed.

As those in the first variant example and the second variant example, in the cases where a plurality of the well layers interposed between the second well layers 15a are employed, the number and order of stacking of the well layers can be adjusted according to the ratio of emission peak intensity of the desired emission spectrum. As described above, emission is likely more difficult in the second well layer which has a larger band gap energy than in the first well layer. Therefore, for example, in order to produce approximately the same intensity in the two peaks in emission spectrum, it is preferable to stack greater number of the second well layers than the first well layers. Also, as described above, emission is likely easier in a side closer to the p-type nitride semiconductor layer, so that a greater number of the second well layers are preferably disposed at the p-type nitride semiconductor layer side than the first well layers. In the example as shown in FIG. 4, the number of stacked layers of the second well layers 15a, 15b is greater than the first well layers 14 and also a greater number of the second well layers 15a, 15b are disposed at the p-type nitride semiconductor layer 13 side. Therefore, approximately the same intensity can be expected in the two emission peaks corresponding to the respective well layers.

Figure 5:
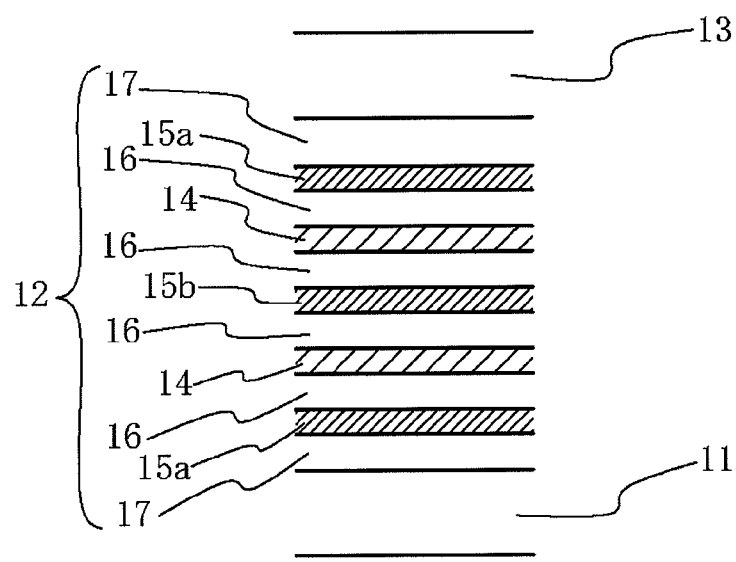
FIG. 5 is a cross-sectional view schematically showing the active layer according to a third variant example.

Also, as in a third variant example shown in FIG. 5, the second well layers 15a, 15b and the first well layers 14 can be alternately stacked. With such a structure, each of the first well layers can be interposed between the second well layers, so that efficient electric confinement can be obtained and the luminous efficiency can be improved and the ratio of emission peak intensity can be further stabilized. Also, the outermost well layers are the second well layers 15a, so that the number of layers of the second well layer is consequently larger, thus the two emission peaks corresponding to the respective well layers can be easily made with approximately the same intensity.

Each member of the nitride semiconductor light emitting element shown in FIG. 1 will be described in detail below.

(Substrate 10)

Substrate 10 is a substrate which allows epitaxial growth of a semiconductor layer, and the size, thickness, and the like of the substrate are not specifically limited. Examples of the substrate used for a nitride semiconductor include an insulating substrate such as sapphire with a main surface of any one of C-plane, R-plane, and A-plane and spinel ($MgAl_2O_4$), silicon carbides (6H, 4H, 3C), ZnS, Si, GaAs, diamond, and an oxide substrate such as lithium niobate and neodymium gallate which form a lattice junction with the nitride semiconductor, a nitride semiconductor substrate such as GaN and AlN. Also, an aforementiond substrate with an off-angle (for example, 0.01°-3.0° on sapphire C-plane) can be used.

(n-Type Nitride Semiconductor Layer 11, p-Type Nitride Semiconductor Layer 13)

A nitride semiconductor layer represented by a general formula $In_xAl_yGa_{1-x-y}N$ ($0<x<1$, $0<y<1$, $0<x+y<1$) can be used as the n-type nitride semiconductor layer 11 and the p-type nitride semiconductor layer 13. Herein, a part of III element may be substituted with B and a part of V element may be substituted with P or As. $In_xAl_dGa_{1-d}N$ ($0<d<1$) is exemplified as the n-type nitride semiconductor layer 11 and the p-type nitride semiconductor layer 13. The n-type nitride semiconductor layer may contain at least one element of group IV element or group VI element such as Si, Ge, Sn, S, O, Ti, Zr and Cd, as the n-type impurity. The p-type nitride semiconductor layer may contain Mg, Zn, Be, Mn, Ca, or Sr etc. as the p-type impurity. It is preferable that the impurity is contained at concentration range of, for example, about $5×10^{16}/cm^3$ to about $1×10^{21}/cm^3$.

(Active Layer 12)

The active layer 12 includes the first well layer 14, the second well layer 15, and the barrier layers 16, 17. A layer represented by a general formula $In_xAl_yGa_{1-x-y}N$ ($0≦x≦1$, $0≦y≦1$, $0≦x+y≦1$) can be used as the well layers 14, 15 and the barrier layers 16, 17. In addition, the active layer 12 may have a multiquantum well structure.

(Well Layers 14, 15)

The first well layer 14 and the second well layer 15 are respectively made of nitride semiconductors having different compositions so that the emission spectrum of the nitride semiconductor light emitting element has two peaks corresponding to each well layer. Herein, the emission spectrum having two peaks includes, for example, a status of two emission peaks with a bottom therebetween, and a status of two emission peaks with a inflection point therebetween. Examples of the composition of the first well layer 14 and the second well layer 15 include, in a case where a nitride semiconductor contains at least In, a composition in which the In composition ration in the second well layer 15 is smaller than the In composition ratio in the first well layer 14, more specifically, the first well layer 14 is $In_aGa_{1-a}N$ ($0<a<1$) and the second well layer 15 is $In_bGa_{1-b}N$ ($0<b<1$, $b<a$). It is considered that a emission spectrum having two peaks is easy to obtain when the difference between the two emission peaks is about 10 nm or greater. Specifically, the first well layer 14 may be $In_aGa_{1-a}N$ ($0<a<1$) and the second well layer 15 may be $In_bGa_{1-b}N$ ($0<b<1$, $a-b≧0.02$). The optimum growth conditions differ when the compositions of the well layers are different. Therefore, for example, the difference in the composition ratio between the first well layer 14 $In_aGa_{1-a}N$ and the second well layer 15 $In_bGa_{1-b}N$ is preferably 0.10 or smaller, further preferably 0.04 or smaller.

It is preferable that in a case where the compositions of the first well layer 14 and the second well layer 15 are such that the peak wavelength of the emission spectrum of the element is in the near-ultraviolet region or ultraviolet region, the element can be used as a light source for curing a resin or the like. Moreover, a composition capable of obtaining a peak wavelength of 420 nm or smaller is preferable. Specifically, the first well layer 14 may be $In_aGa_{1-a}N$ ($0<a≦0.1$) and the second well layer 15 may be $In_bGa_{1-b}N$ ($0<b<0.1$, $b<a$, more preferably $a-b≦0.02$). In a case where a plurality of the first well layers are employed, fluctuations in the composition among the well layers can be tolerable if the emission spectrum of the element shows two peaks. The aforementioned can also be applied to the second well layer.

By varying the film thickness of the respective well layers, the emission peak intensity can also be adjusted. However, in view of the stability of the emission peak intensity, it is preferable that the thickness of the first well layer and the second well layer are approximately the same. In a case where the composition of each well layer is configured to emit light having wavelength in the near-ultraviolet region or ultraviolet region, the output power tends to increase with the thickness of the well layer of 100 angstroms or more and 1000 angstroms or less.

(Barrier Layers 16, 17)

The barrier layers 16, 17 are disposed at least between each of the well layers 14, 15. Specifically, in a case where the well layers 14, 15 are formed with a composition configured to emit light having wavelength in the near-ultraviolet region or ultraviolet region, the barrier layers are preferably made of $Al_cGa_{1-c}N$ ($0<c≦0.4$). In FIG. 1, the barrier layers 16 are disposed between each of the well layers 14, 15, and the barrier layers 17 are disposed outer side of the second well layers 15 which are disposed outermost sides among the well layers. Such a barrier layer 17 disposed at either one or both of the n-type nitride semiconductor layer 11 side and the p-type nitride semiconductor layer 13 side can be omitted. From the point of view of carrier confinement in the second well layers 15, it is preferable to provide such barrier layers 17.

The barrier layers 16, 17 may be formed in a multilayer structure in which a plurality of layers are stacked. The multilayer structure may have layers made of different materials stacked on top of each other. In such a case, the materials are selected so that the number of peaks in the obtained emission spectrum does not exceed two, and that only the first well layers and the second well layers emit light in the active layer. It is preferable that the barrier layer is made of a single layer or a multilayer composed of stacked layers made of the same material. Also, the thickness of the barrier layers 16, 17 is preferably the same as or greater than the thickness of the first well layer and the second well layer.

(n-Electrode 18, p-Electrode 19)

The electrode material of the n-electrode 18 and the p-electrode 19 is not specifically limited as long as it allows an ohmic contact between the nitride semiconductor layers of each conductive type and respective electrodes. For example, the electrodes may be made of a metal material or an alloy material containing at least one selected from the group consisting of nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag), and yttrium (Y). An oxide or nitride of the aforementioned materials can also be used as the material of the electrodes. The electrodes may be composed of a single layer film using the aforementioned materials, but preferably composed of a multilayer film in which two or more materials are stacked. In addition, the n-electrode 18 and the p-electrode 19 can have the same structure.

Embodiment 2

Figure 6:
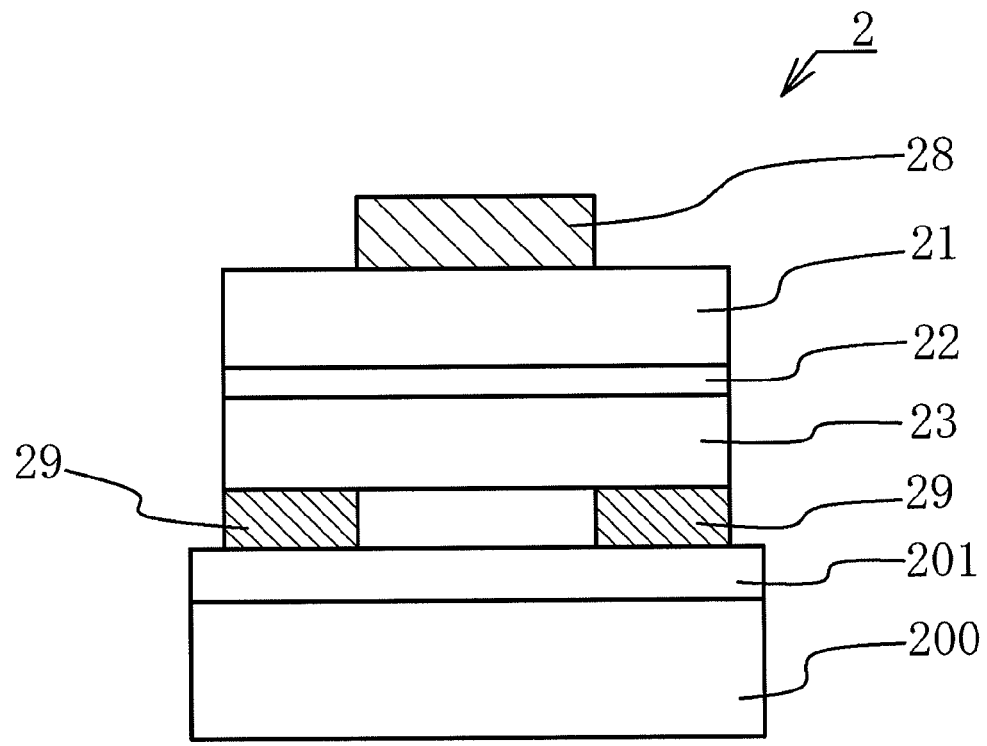
FIG. 6 is a cross-sectional view schematically showing a structure of a nitride semiconductor light emitting element according to Embodiment 2 of the present invention.

FIG. 6 is a cross-sectional view schematically showing a structure of a nitride semiconductor light emitting element according to Embodiment 2 of the present invention. The nitride semiconductor light emitting element 2 has a stacked layer structure in which, the p-type nitride semiconductor layer 23, the active layer 22, the n-type nitride semiconductor layer 21 are stacked in this order via the conductive bonding layer 201 on the supporting substrate 200, and the n-electrode 28 and the p-electrodes 29 are respectively disposed on the opposite sides of the stacked layer structure. As described above, the nitride semiconductor light emitting element 2 of Embodiment 2 has a counter electrode structure in which the p-electrode 29 and the n-electrode 28 are disposed on the respective opposing sides of the stacked layer structure, and the p-electrode 29 side is bonded to the supporting substrate 200. Substantially the same members as in Embodiment 1 can be used as the members common to Embodiment 1, such as the active layer, semiconductor layer, and electrode. With the active layer described above, an emission spectrum having stable two peaks can also be obtained by the nitride semiconductor light emitting element 2 having aforementioned counter electrode structure.

(Supporting Substrate 200)

As the supporting substrate 200, for example, a semiconductor substrate made of semiconductor such as Si, SiC, and the like, or a substrate made of a single metal or a metal substrate made of a complex of two or more metals which are immiscible with each other or have small solid solubility limits, can be used. Further, a complex of Cu—W or Cu—Mo is preferably used as the metal substrate. A complex of a metal of Cu-diamond etc. and ceramics, and the like, can also be used.

(Conductive Bonding Layer 201)

An electrically conductive material is selected for the conductive bonding layer 201 which bonds the supporting substrate 200 and the p-electrode 29. The material for the conductive bonding layer 201 can be selected from, for example, an alloy containing at least one selected from the group consisting of Au, Sn, Pd, and In. The conductive bonding layer can be formed by forming a first metal layer at the p-electrode 29 side and forming a second metal layer at the supporting substrate 200 side, then, eutectically bonding the two metal layers. Each of the metal layers preferably has a structure made of an adhesion layer, a barrier layer and an eutectic layer.

EXAMPLES

Example 1

The nitride semiconductor light emitting element according to Example 1 includes, as shown in FIG. 6, a stacked layer structure in which the p-type nitride semiconductor layer 23, the active layer 22, and the n-type nitride semiconductor layer 21 are stacked via the conductive bonding layer 201 on the supporting substrate 200 made of an alloy of Cu and W, and the p-electrode 29 is disposed at the p-type nitride semiconductor layer 23 side and the n-electrode 28 is disposed at the n-type nitride semiconductor layer 21 side.

The nitride semiconductor light emitting element 2 can be formed as shown below. First, using a substrate made of sapphire (C-plane) as the growth substrate, a buffer layer made of GaN with a thickness of 200 angstromes and an under layer made of undoped GaN with a thickness of 4 μm are grown in this order on the substrate. Next, as the n-type nitride semiconductor layer 21, an n-type contact layer of Si-doped $Al_{0.07}Ga_{0.93}N$ is grown to a thickness of about 2 μm.

Next, as the active layer 22, a barrier layer of Si-doped $Al_{0.1}Ga_{0.9}N$, and thereon, a second well layer of undoped $In_{0.01}Ga_{0.99}N$ and a first well layer of undoped $In_{0.05}Ga_{0.95}N$ are stacked in the order of barrier layer (1)/second well layer/barrier layer (2)/first well layer/barrier layer (3)/second well layer/barrier layer (4)/first well layer/barrier layer (5)/second well layer/barrier layer (6). At this time, each of the barrier layers (1) to (5) is grown to a thickness of 200 angstroms, the barrier layer (6) is grown to a thickness of 400 angstroms, and each of the first well layer and the second well layer is grown to a thickness of 150 angstroms. Only the barrier layer (6) is undoped.

On the active layer 22, as the p-type nitride semiconductor layer 23, a p-type cladding layer of Mg-doped $Al_{0.3}Ga_{0.7}N$ with a thickness of 220 angstromes, a first p-type contact layer of $Al_{0.07}Ga_{0.93}N$ with a thickness of 0.1 μm, a second p-type contact layer of Mg-doped $Al_{0.07}Ga_{0.93}N$ with a thickness of 0.02 μm are grown in this order. Then, after a metal film containing Ag is formed on the second p-type contact layer to make the p-electrode 29, although not shown in the drawing, an insulating protective film of $SiO_2$ is formed on the exposed surfaces of the second p-type contact layer except on the p-electrode 29.

Next, on the p-electrode 29, a first metal layer containing Sn is formed. On the other hand, as the supporting substrate 200, using a metal substrate of a complex made of Cu and W, a second metal layer containing Pd is formed on the surface of the metal substrate. Then, the first metal layer and the second metal layer are placed facing with each other, the nitride semiconductor stacked layer structure and the metal substrate are thermally welded by heat and pressure. With this, a part of metal in the first metal layer and the second metal layer is diffused into each other to form an eutectic composition.

Then, laser beam is irradiated through the back surface of the sapphire substrate which is the growth substrate, so that the nitride semiconductor constituting the underlayer is decomposed and the sapphire substrate is removed. The n-electrode 28 is formed on the n-type contact layer exposed in this manner. Thereafter, although not shown in the drawing, a substrate back surface electrode is formed on the buck surface of the conductive supporting substrate 200. Then, each of the elements is separated by dicing to obtain the nitride semiconductor light emitting elements 2 with a size of about 1 mm×about 1 mm.

Figure 7:
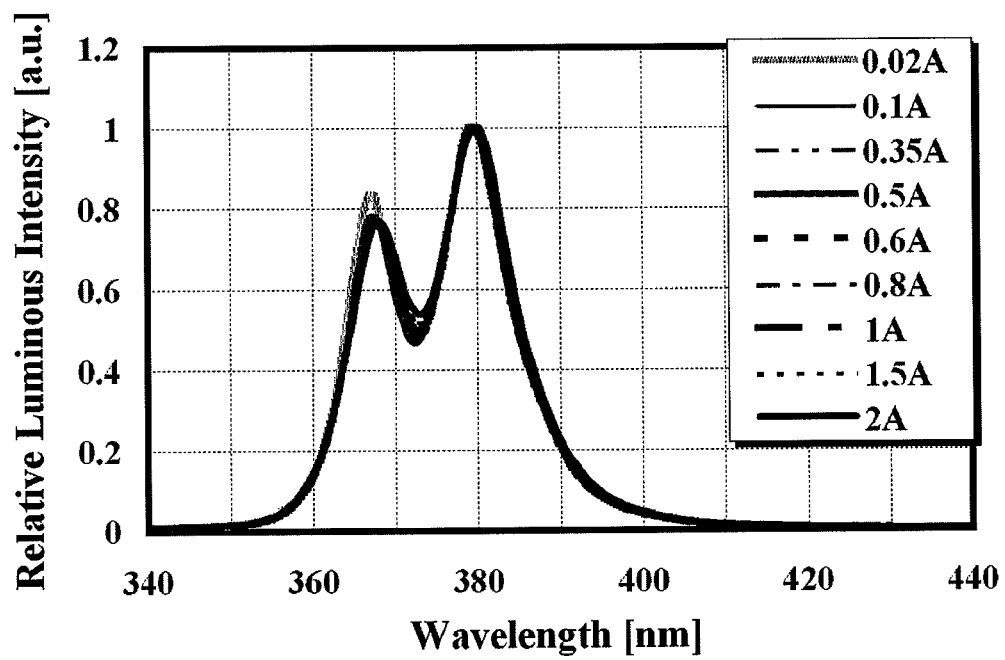
FIG. 7 is a graph showing relationship between electric current and emission spectrum of nitride semiconductor light emitting element according to Example 1.

The emission spectra of obtained nitride semiconductor light emitting element were measured with varying forward current in a range of 0.02 A to 2 A. The results are graphically shown in FIG. 7. As shown in FIG. 7, the nitride semiconductor light emitting element according to Example 1 exhibited emission spectra with two peaks at about 367 nm and about 380 nm, and it was confirmed that the ratio of luminous intensity little changes with varying forward current and stabilized.

Comparative Example 1

The nitride semiconductor light emitting element according to Comparative Example 1 is formed in the same manner as in Example 1 except for the structure of the active layer 22 shown below.

As the active layer, the barrier layer, the first well layer, and the second well layer are stacked in such order as barrier layer (1)/first well layer/barrier layer (2)/first well layer/barrier layer (3)/second well layer/barrier layer (4)/second well layer/barrier layer (5)/second well layer/barrier layer (6). That is, two layers of the first well layer and three layers of the second well layer are stacked in the order from the n-type nitride semiconductor layer side.

Figure 8:
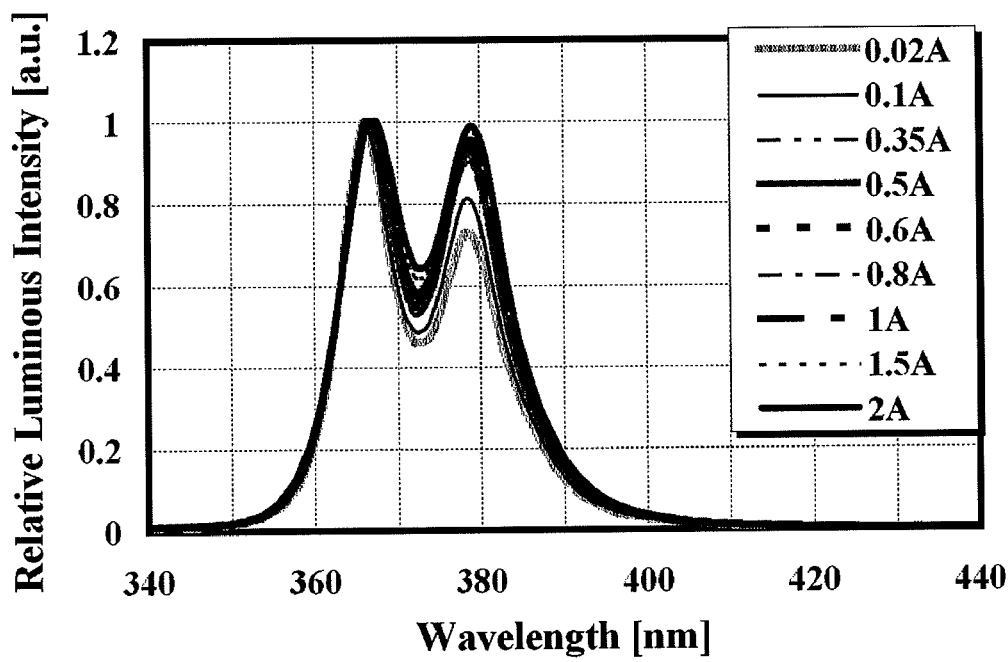
FIG. 8 is a graph showing relationship between electric current and emission spectrum of nitride semiconductor light emitting element according to Comparative Example 1.
Figure 9:
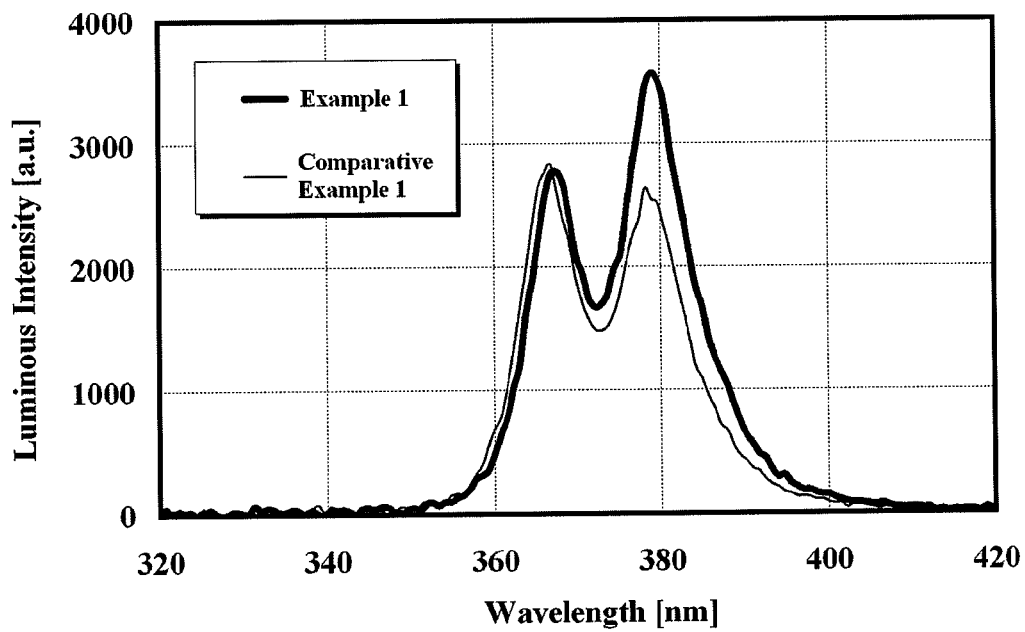
FIG. 9 is a graph showing emission spectra of nitride semiconductor light emitting elements according to Example 1 and Comparative Example 1.

The emission spectra of obtained nitride semiconductor light emitting element were measured with varying forward current in a range of 0.02 A to 2 A. The results are graphically shown in FIG. 8. As shown in FIG. 8, the nitride semiconductor light emitting element according to Comparative Example 1 has emission spectra having peaks at about 367 nm and about 380 nm. However, the luminance intensity in the vicinity of 370 nm to 380 nm decreased with varying the current and a stable ratio of luminous intensity could not be achieved. The emission spectra obtained by applying the current of 0.5 A respectively to the nitride semiconductor light emitting elements according to Example 1 and Comparative Example 1 are graphically shown in FIG. 9. In every graph shown in FIG. 9, the horizontal axis represents wavelength and the vertical axis represents luminous intensity. Both Example 1 and Comparative Example 1 exhibited almost the same luminous intensity at a shorter wavelength side, but Comparative Example 1 exhibited a smaller luminous intensity in the vicinity of the peak at longer wavelength side than that of Example 1, so that a decrease in the luminous efficiency was confirmed.

Comparative Example 2

The nitride semiconductor light emitting element according to Comparative Example 2 is formed in the same manner as in Example 1 except for the structure of the active layer 22 shown below.

As the active layer, the barrier layer, the first well layer, and the second well layer are stacked in such order as barrier layer (1)/second well layer/barrier layer (2)/second well layer/barrier layer (3)/second well layer/barrier layer (4)/first well layer/barrier layer (5)/first well layer/barrier layer (6). That is, three layers of the second well layer and two layers of the first well layer are stacked in the order from the n-type nitride semiconductor layer side.

The emission spectra of obtained nitride semiconductor light emitting element were measured with varying forward current in a range of 0.02 A to 2 A. The results are graphically shown in FIG. 10.

Figure 10:
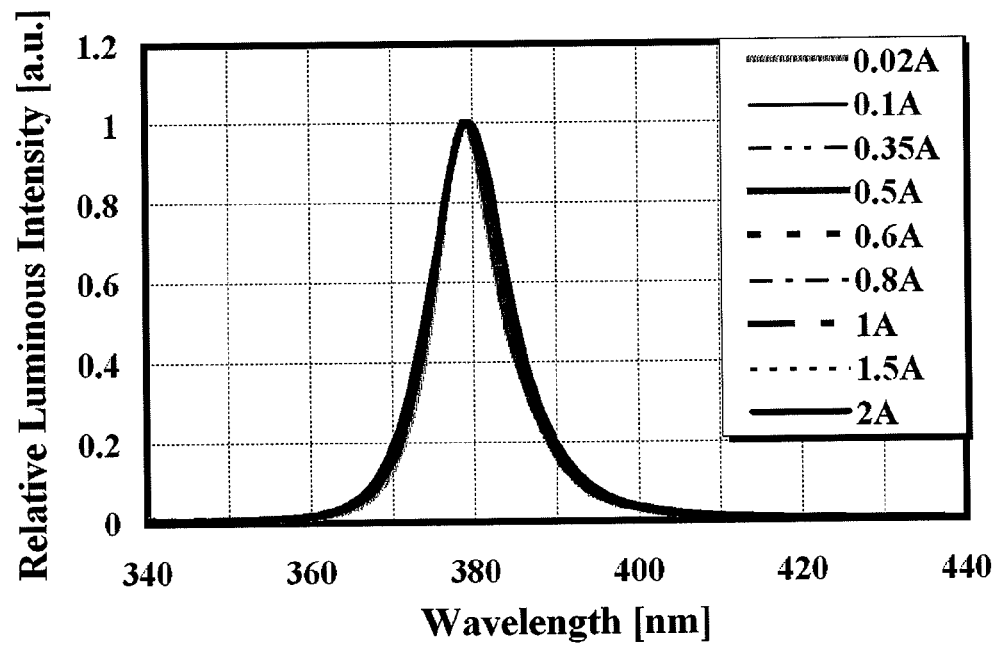
FIG. 10 is a graph showing relationship between electric current and emission spectrum of nitride semiconductor light emitting element according to Comparative Example 2.

As shown in FIG. 10, the nitride semiconductor light emitting element according to Comparative Example 2 exhibited emission spectra of single peak having a peak at about 380 nm and two peaks were not produced.

Comparative Example 3

The nitride semiconductor light emitting element of Comparative Example 3 is formed in the same manner as in Example 1 except for the structure of the active layer 22 shown below.

As the active layer, the barrier layer, the first well layer, and the second well layer are stacked in such order as barrier layer (1)/second well layer/barrier layer (2)/first well layer/barrier layer (3)/second well layer/barrier layer (4)/first well layer/barrier layer (6). That is, the second well layer and the first well layer are alternately stacked in the order from the n-type nitride semiconductor layer side and the last layer of the second well layer is not stacked. In this structure, the well layer closest to the p-type nitride semiconductor layer is the first well layer.

Figure 11:
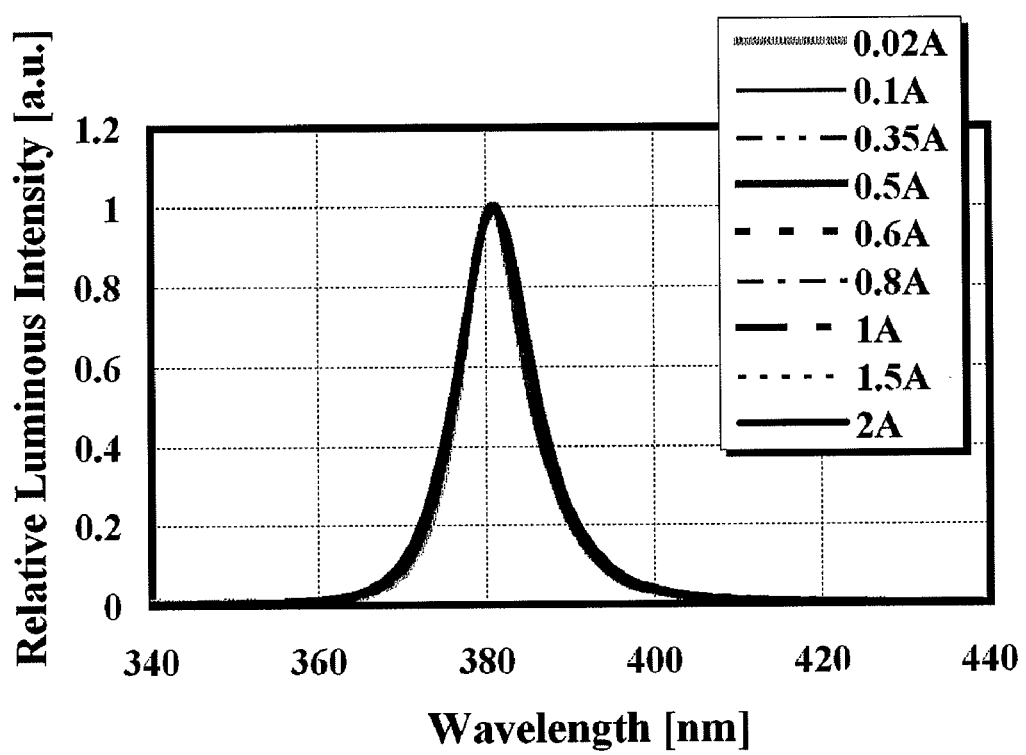
FIG. 11 is a graph showing relationship between electric current and emission spectrum of nitride semiconductor light emitting element according to Comparative Example 3.

The emission spectra of obtained nitride semiconductor light emitting element were measured with varying forward current in a range of 0.02 A to 2 A. The results are graphically shown in FIG. 11. As shown in FIG. 11, the nitride semiconductor light emitting element according to Comparative Example 3 exhibited emission spectra of single peak having a peak at about 380 nm and two peaks were not produced as the nitride semiconductor light emitting element according to Comparative Example 2.

Example 2

The nitride semiconductor light emitting element according to Example 2 is formed in the same manner as in Example 1 except that the first well layer is undoped $In_{0.06}Ga_{0.94}N$.

Figure 12:
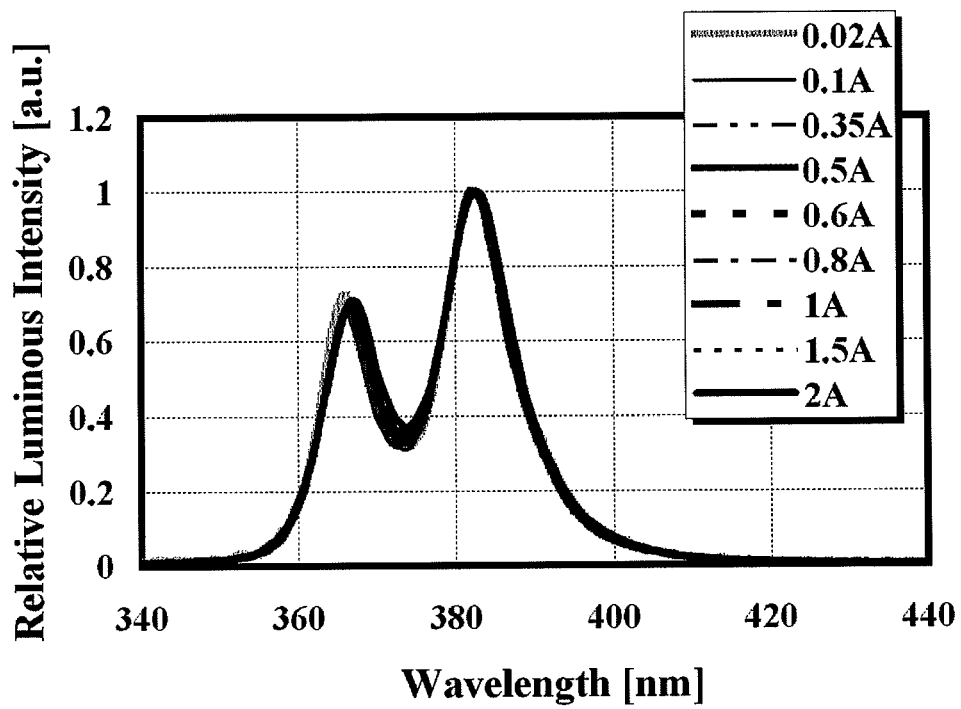
FIG. 12 is a graph showing relationship between electric current and emission spectrum of nitride semiconductor light emitting element according to Example 2.

The emission spectra of obtained nitride semiconductor light emitting element were measured with varying forward current in a range of 0.02 A to 2 A, and graphically shown in FIG. 12. As shown in FIG. 12, the nitride semiconductor light emitting element according to Example 2 exhibited emission spectra with two peaks at about 367 nm and about 382 nm, and it was confirmed that the ratio of luminous intensity little changes with varying the current and stabilized.

Example 3

The nitride semiconductor light emitting element of Example 3 is formed in the same manner as in Example 1 except that the first well layer is undoped $In_{0.08}Ga_{0.92}N$ and the second well layer is undoped $In_{0.06}Ga_{0.94}N$.

Figure 13:
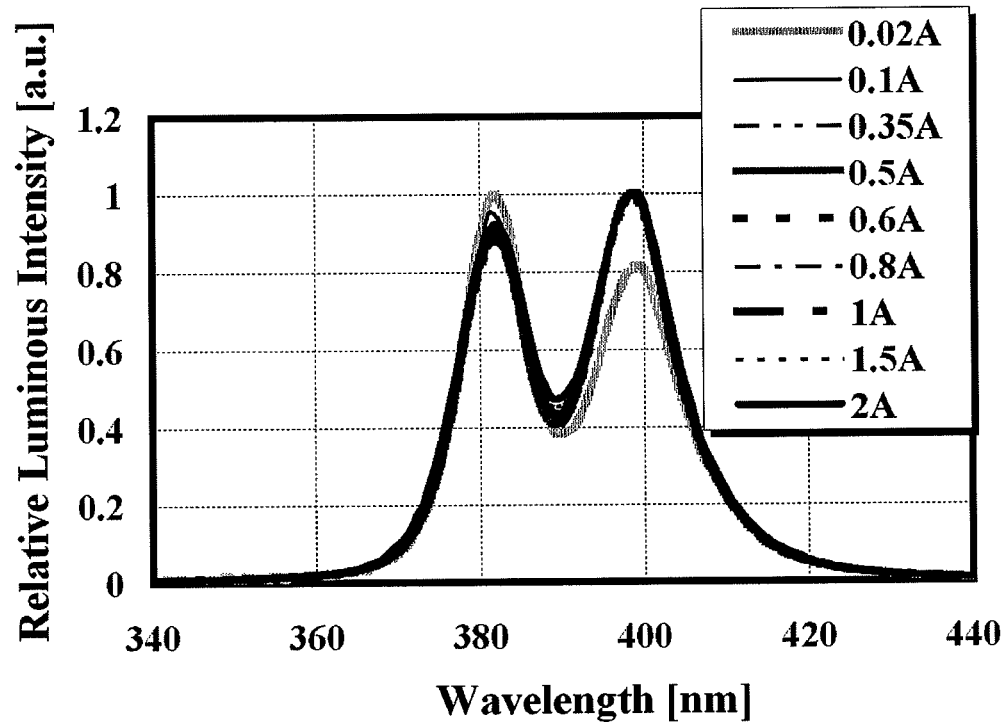
FIG. 13 is a graph showing relationship between electric current and emission spectrum of nitride semiconductor light emitting element according to Example 3.

The emission spectra of obtained nitride semiconductor light emitting element were measured with varying forward current in a range of 0.02 A to 2 A, and graphically shown in FIG. 13. As shown in FIG. 13, the nitride semiconductor light emitting element of Example 3 has emission spectra with two peaks at about 382 nm and about 399 nm. It was confirmed that the change in the ratio of luminous intensity with respect to the current was slightly different in the cases with 0.02 A compare to other cases, but in the cases with 0.1 A or greater, it was stabilized with little change even when the current was varied.

Example 4

The nitride semiconductor light emitting element according to Example 4 is formed in the same manner as in Example 1 except that the first well layer is undoped $In_{0.08}Ga_{0.92}N$.

Figure 14:
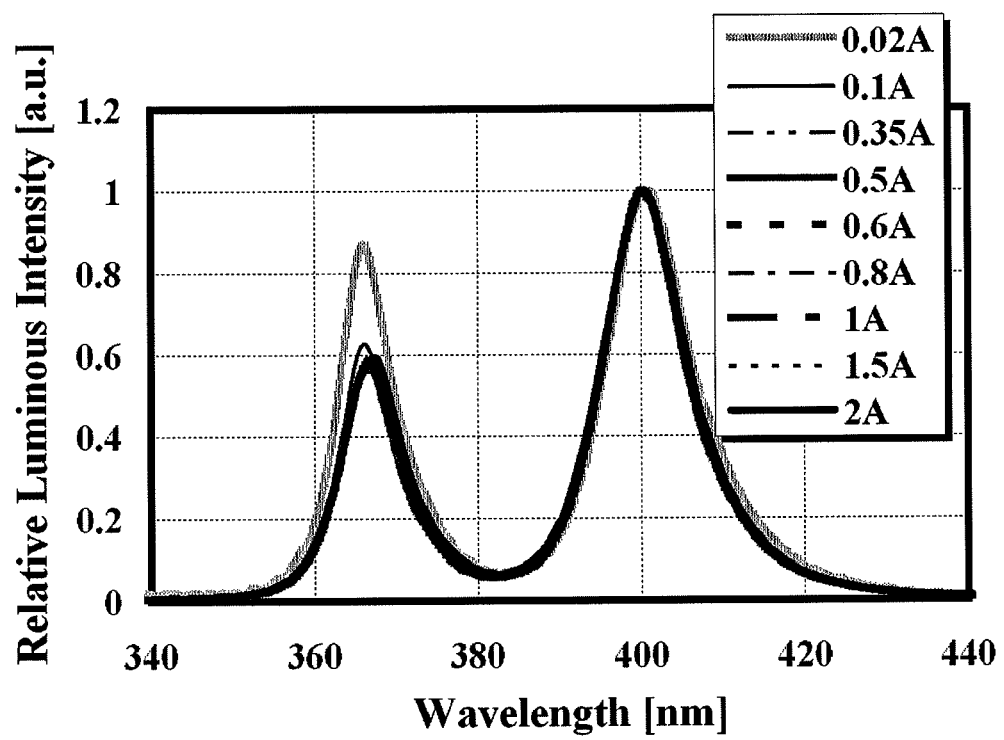
FIG. 14 is a graph showing relationship between electric current and emission spectrum of nitride semiconductor light emitting element according to Example 4.

The emission spectra of obtained nitride semiconductor light emitting element were measured with varying forward current in a range of 0.02 A to 2 A, and graphically shown in FIG. 14. As shown in FIG. 14, the nitride semiconductor light emitting element of Example 4 had emission spectra with two peaks at about 367 nm and about 400 nm. It was confirmed that the change in the ratio of luminous intensity with respect to the current was slightly different in the cases with 0.02 A compare to other cases, but in the cases with 0.1 A or greater, it was stabilized with little change even when the current was varied.

INDUSTRIAL APPLICABILITY

The semiconductor light emitting element according to the present invention is capable to be used as various light sources, particularly, suitably used as a light source for exposure apparatus for curing such as light curing resins, adhesives, and coating materials. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A nitride semiconductor light emitting element comprising:
    an active layer disposed between an n-type nitride semiconductor layer and a p-type nitride semiconductor layer;
    the active layer comprising a first well layer, second well layers interposing the first well layer and disposed at outermost sides among the well layers, and barrier layers disposed between each of the well layers;
    the second well layers comprising a nitride semiconductor having a larger band gap energy than the band gap energy of a nitride semiconductor constituting the first well layer, and
    the nitride semiconductor light emitting element having peaks in the emission spectrum respectively corresponding to the first well layer and the second well layer.

2. The nitride semiconductor light emitting element according to claim 1, wherein a plurality of the first well layers are disposed between the second well layers disposed at outermost sides.

3. The nitride semiconductor light emitting element according to claim 1, wherein the second well layers comprises outermost second well layers disposed at outermost sides among the well layers and at least one inner second well layer between the outermost second well layers, and at least one first well layer is disposed closer to the n-type semiconductor layer side than the inner second well layer.

4. The nitride semiconductor light emitting element according to claim 3, wherein the number of layers of the second well layer is greater than the number of layers of the first well layer.

5. The nitride semiconductor light emitting element according to claim 1, wherein a plurality of the first well layers and a plurality of the second well layers are alternately stacked.

6. The nitride semiconductor light emitting element according to claim 1, wherein the peaks in the emission spectrum respectively corresponding to the first well layer and the second well layer are in the near-ultraviolet or ultraviolet region.

7. The nitride semiconductor light emitting element according to claim 1, wherein the first well layer is $In_aGa_{1-a}N$ ($0<a\leq1$) and the second well layer is $In_bGa_{1-b}N$ ($0<b<1$, $a-b\geq0.02$).

8. The nitride semiconductor light emitting element according to claim 1, wherein the first well layer is $In_aGa_{1-a}N$ ($0<a\leq0.1$), the second well layer is $In_bGa_{1-b}N$ ($0<b<0.1$, $a-b\geq0.02$), and the barrier layer is $Al_cGa_{1-c}N$ ($0<c\leq0.4$).

9. The nitride semiconductor light emitting element according to claim 8, wherein the n-type nitride semiconductor layer and the p-type semiconductor layer are $Al_dGa_{1-d}N$ ($0<d\leq1$).

10. A nitride semiconductor light emitting element comprising:
    an active layer disposed between an n-type nitride semiconductor layer and a p-type nitride semiconductor layer;
    the active layer comprising a first well layer, second well layers interposing the first well layer and disposed at outermost sides among the well layers, and barrier layers disposed between each of the well layers;
    the second well layers comprising a nitride semiconductor having a larger band gap energy than the band gap energy of a nitride semiconductor constituting the first well layer,
    the nitride semiconductor light emitting element having peaks in the emission spectrum respectively corresponding to the first well layer and the second well layer, and
    the second well layers comprises outermost second well layers disposed at outermost sides among the well layers and at least one inner second well layer between the outermost second well layers, and at least one first well layer is disposed closer to the n-type semiconductor layer side than the inner second well layer.

11. The nitride semiconductor light emitting element according to claim 10, wherein the number of layers of the second well layer is greater than the number of layers of the first well layer.

12. The nitride semiconductor light emitting element according to claim 11, wherein a plurality of the first well layers and a plurality of the second well layers are alternately stacked.

13. The nitride semiconductor light emitting element according to claim 12, wherein the peaks in the emission spectrum respectively corresponding to the first well layer and the second well layer are in the near-ultraviolet or ultraviolet region.

14. A nitride semiconductor light emitting element comprising:
    an active layer disposed between an n-type nitride semiconductor layer and a p-type nitride semiconductor layer;
    the active layer comprising a first well layer, second well layers interposing the first well layer and disposed at outermost sides among the well layers, and barrier layers disposed between each of the well layers;
    the second well layers comprising a nitride semiconductor having a larger band gap energy than the band gap energy of a nitride semiconductor constituting the first well layer, and
    the nitride semiconductor light emitting element having peaks in the emission spectrum respectively corresponding to the first well layer and the second well layer and
    the peaks in the emission spectrum respectively corresponding to the first well layer and the second well layer are in the near-ultraviolet or ultraviolet region.

15. The nitride semiconductor light emitting element according to claim 14, wherein a plurality of the first well layers are disposed between the second well layers disposed at outermost sides.

16. The nitride semiconductor light emitting element according to claim 14, wherein the second well layers comprises outermost second well layers disposed at outermost sides among the well layers and at least one inner second well layer between the outermost second well layers, and at least one first well layer is disposed closer to the n-type semiconductor layer side than the inner second well layer.

17. The nitride semiconductor light emitting element according to claim 16, wherein the number of layers of the second well layer is greater than the number of layers of the first well layer.

18. The nitride semiconductor light emitting element according to claim 16, wherein a plurality of the first well layers and a plurality of the second well layers are alternately stacked.

* * * * *